(12) United States Patent
Stamper et al.

(10) Patent No.: US 12,336,285 B2
(45) Date of Patent: Jun. 17, 2025

(54) FIELD EFFECT TRANSISTOR WITH SHALLOW TRENCH ISOLATION FEATURES WITHIN SOURCE/DRAIN REGIONS

(71) Applicant: GLOBALFOUNDRIES U.S. Inc., Malta, NY (US)

(72) Inventors: Anthony K. Stamper, Burlington, VT (US); Uzma Rana, Slingerlands, VT (US); Siva P. Adusumilli, South Burlington, VT (US); Steven M. Shank, Jericho, VT (US)

(73) Assignee: GLOBALFOUNDRIES U.S. Inc., Malta, NY (US)

( * ) Notice: Subject to any disclaimer, the term of this patent is extended or adjusted under 35 U.S.C. 154(b) by 0 days.

(21) Appl. No.: 18/231,322

(22) Filed: Aug. 8, 2023

(65) Prior Publication Data

US 2023/0378183 A1   Nov. 23, 2023

Related U.S. Application Data

(63) Continuation of application No. 17/344,391, filed on Jun. 10, 2021, now Pat. No. 11,764,225.

(51) Int. Cl.
| | |
|---|---|
| *H10D 86/00* | (2025.01) |
| *H01L 21/28* | (2025.01) |
| *H01L 21/285* | (2006.01) |
| *H10D 64/62* | (2025.01) |
| *H10D 64/66* | (2025.01) |
| *H10D 86/01* | (2025.01) |

(52) U.S. Cl.
CPC ...... *H10D 86/201* (2025.01); *H01L 21/28052* (2013.01); *H01L 21/28518* (2013.01); *H10D 64/62* (2025.01); *H10D 64/663* (2025.01); *H10D 86/01* (2025.01)

(58) Field of Classification Search
CPC .................. H01L 21/84; H01L 21/76224
See application file for complete search history.

(56) References Cited

U.S. PATENT DOCUMENTS

| | | | |
|---|---|---|---|
| 4,948,745 A | 8/1990 | Pfiester et al. | |
| 1,966,861 A | 10/1990 | Mieno et al. | |
| 5,213,991 A | 5/1993 | Inokawa et al. | |
| 5,508,211 A * | 4/1996 | Yee ................... | H01L 21/76264 257/E21.564 |
| 5,612,230 A | 3/1997 | Yuzurihara | |

(Continued)

FOREIGN PATENT DOCUMENTS

KR   20080062064   7/2008

OTHER PUBLICATIONS

Final Office Action dated Apr. 12, 2024 in related U.S. Appl. No. 17/330,780, 7 pages.

(Continued)

*Primary Examiner* — Vincent Wall
(74) *Attorney, Agent, or Firm* — Francois Pagette; Andrew M. Calderon; Calderon Safran & Wright P.C.

(57) ABSTRACT

The present disclosure relates to semiconductor structures and, more particularly, to field effect transistors and methods of manufacture. The structure includes: at least one gate structure comprising source/drain regions; and at least one isolation structure perpendicular to the at least one gate structure and within the source/drain regions.

16 Claims, 9 Drawing Sheets

(56) References Cited

U.S. PATENT DOCUMENTS

| | | |
|---|---|---|
| 5,872,039 A | 2/1999 | Mai |
| 6,051,473 A | 4/2000 | Ishida et al. |
| 6,124,627 A | 9/2000 | Rodder et al. |
| 6,130,457 A | 10/2000 | Yu et al. |
| 6,174,754 B1 * | 1/2001 | Lee .................. H01L 29/66651 438/149 |
| 6,211,552 B1 | 4/2001 | Efland |
| 6,235,568 B1 * | 5/2001 | Murthy ........... H01L 21/823814 438/300 |
| 6,299,314 B1 * | 10/2001 | Igarashi ............ H01L 21/76897 257/E21.627 |
| 6,372,584 B1 | 4/2002 | Yu |
| 6,724,049 B2 | 4/2004 | Fujiwara |
| 6,743,666 B1 * | 6/2004 | Chan .................... H01L 29/458 257/E29.147 |
| 6,821,856 B2 | 11/2004 | Takagi |
| 6,833,586 B2 | 12/2004 | Tsuchiko |
| 7,078,722 B2 | 7/2006 | Anderson et al. |
| 7,315,067 B2 | 1/2008 | Wang |
| 7,385,274 B2 | 6/2008 | Lee |
| 7,671,423 B2 | 3/2010 | Voldman |
| 8,101,479 B2 * | 1/2012 | Parker ................. H01L 21/2652 438/231 |
| 8,174,071 B2 | 5/2012 | Tien |
| 8,183,633 B2 | 5/2012 | Kwon et al. |
| 8,288,825 B2 | 10/2012 | Chong et al. |
| 8,575,691 B2 | 11/2013 | Liu |
| 8,754,530 B2 | 6/2014 | Babich et al. |
| 9,136,329 B2 | 9/2015 | Huang et al. |
| 9,240,454 B1 * | 1/2016 | Liu ....................... H01L 29/456 |
| 9,748,383 B2 | 8/2017 | Hu |
| 10,580,893 B2 | 3/2020 | Adusumilli et al. |
| 10,763,213 B2 * | 9/2020 | Delalleau .............. H01L 23/535 |
| 10,763,328 B2 | 9/2020 | Aydin et al. |
| 2002/0137295 A1 | 9/2002 | Thei et al. |
| 2004/0180536 A1 * | 9/2004 | Fujiwara ............. H01L 21/3185 257/E21.546 |
| 2007/0018236 A1 | 1/2007 | Tsuchiaki |
| 2007/0057280 A1 | 3/2007 | Hayashi |
| 2008/0067615 A1 | 3/2008 | Kim |
| 2008/0290411 A1 | 11/2008 | Lee |
| 2012/0313151 A1 | 12/2012 | Lee |
| 2013/0210207 A1 | 8/2013 | Fukuda et al. |
| 2015/0021738 A1 | 1/2015 | Camillo-Castillo et al. |
| 2015/0035568 A1 | 2/2015 | Peng et al. |
| 2016/0020138 A1 * | 1/2016 | Chang ............... H01L 21/76224 257/508 |
| 2016/0204128 A1 * | 7/2016 | Baars .................. H01L 29/0847 257/350 |
| 2018/0166536 A1 | 6/2018 | Shank et al. |
| 2019/0123166 A1 * | 4/2019 | Kanawati .............. H01L 23/535 |
| 2019/0312142 A1 | 10/2019 | Adusumilli et al. |
| 2021/0167205 A1 | 6/2021 | Wang et al. |
| 2022/0320087 A1 * | 10/2022 | Lu ..................... H01L 21/76283 |
| 2022/0384659 A1 | 12/2022 | Stamper et al. |

OTHER PUBLICATIONS

Response to Final Office Action dated Jun. 5, 2024 in related U.S. Appl. No. 17/330,780, 13 pages.

Office Action in U.S. Appl. No. 17/330,780 dated Nov. 16, 2023, 10 pages.

Huang et al., "A MOS Transistor with Self-Aligned Polysilicon Source-Drain", IEEE, May 1986, vol. EDL-7, No. 5, 3 pages.

Wikimedia Commons, "CMOS-chip structure in 2000s", https://commons.wikimedia.org/wiki/File:Cmos-chip_structure_in_2000s_(en).svg, Dec. 9, 2006 (Year: 2006).

\* cited by examiner

FIELD EFFECT TRANSISTOR WITH SHALLOW TRENCH ISOLATION FEATURES WITHIN SOURCE/DRAIN REGIONS

FIELD OF THE INVENTION

The present disclosure relates to semiconductor structures and, more particularly, to field effect transistors and methods of manufacture.

BACKGROUND

Radio frequency (RF) devices are used in many different types of communication applications. For example, RF devices can be used in cellular telephones with wireless communication components such as switches, MOSFETs, transistors and diodes. Currently, there is an increasing need to provide higher performance and lower price points for the wireless communication components. A significant fraction of the cost of manufacturing a RF switch, for example, is the cost to engineer very high linearity such that harmonic distortion is extremely low and meets product specifications.

RF devices formed on bulk silicon substrate have high source/drain junction capacitance as compared to similar devices formed on SOI wafers, which degrades Coff. Also, devices built on bulk Si substrates have been known to suffer from degraded linearity, harmonics, noise, and leakage currents, any of which will degrade device performance thus necessitating the higher cost of SOI wafers.

Accordingly, RF devices are typically manufactured on high resistivity silicon wafers or substrates to achieve the needed RF linearity. State-of-the-art trap rich semiconductor on insulator (SOI) high resistivity substrates offer excellent vertical isolation and linearity, but the SOI wafer can be a significant cost factor in the total manufacturing cost.

SUMMARY

In an aspect of the disclosure, a structure comprises: at least one gate structure comprising source/drain regions; and at least one isolation structure perpendicular to the at least one gate structure and within the source/drain regions.

In an aspect of the disclosure, a structure comprises: a semiconductor substrate; a plurality of gate structures each of which comprise source/drain regions in the semiconductor substrate; at least one shallow trench isolation structure within the semiconductor substrate, and deeper than the source/drain regions; and silicide on the semiconductor substrate in the source/drain regions and adjacent to the at least one shallow trench isolation structure.

In an aspect of the disclosure, a method comprises: forming at least one gate structure comprising source/drain regions; and forming at least one isolation structure perpendicular to the at least one gate structure and within the source/drain regions.

BRIEF DESCRIPTION OF THE DRAWINGS

The present disclosure is described in the detailed description which follows, in reference to the noted plurality of drawings by way of non-limiting examples of exemplary embodiments of the present disclosure.

DETAILED DESCRIPTION

The present disclosure relates to semiconductor structures and, more particularly, to field effect transistors and methods of manufacture. More specifically, the field effect transistors include shallow trench isolation structures in diffusion regions (e.g., source/drain regions). Advantageously, the placement of the shallow trench isolation structures in the source/drain regions will reduce Coff in bulk technologies without degrading contact resistance (Ron). For example, Coff in bulk technologies can be reduced by greater than 5% by the use of the shallow trench isolation structures in the source/drain regions. Moreover, the use of the shallow trench isolation structures in the source/drain regions can be of benefit to logic FET (e.g., reduced load capacitance) and low noise amplifiers (LNA) (e.g., improved Ft/Fm and gain), etc.

In embodiments, the field effect transistor (FET) may be a single finger or multi-finger FET with shallow trench isolation structures in both, between active devices and in source/drain regions. The use of the shallow trench isolation structures will effectively reduce the area of the diffusion regions, e.g., eliminate semiconductor material in the source/drain regions between adjacent FETs. In this way, the shallow trench isolation structures will reduce Coff in bulk semiconductor technologies, e.g., reduce the area capacitance Cj term. For example, in embodiments, the shallow trench isolation structures can be used to mimic semiconductor on insulator (SOI) substrates to provide a higher substrate resistivity and, hence, reduce Coff in bulk semiconductor technologies.

The FETs of the present disclosure can be manufactured in a number of ways using a number of different tools. In general, though, the methodologies and tools are used to form structures with dimensions in the micrometer and nanometer scale. The methodologies, i.e., technologies, employed to manufacture the FETs of the present disclosure have been adopted from integrated circuit (IC) technology. For example, the structures are built on wafers and are realized in films of material patterned by photolithographic processes on the top of a wafer. In particular, the fabrication of the FETs uses three basic building blocks: (i) deposition of thin films of material on a substrate, (ii) applying a patterned mask on top of the films by photolithographic imaging, and (iii) etching the films selectively to the mask.

Figure 1:
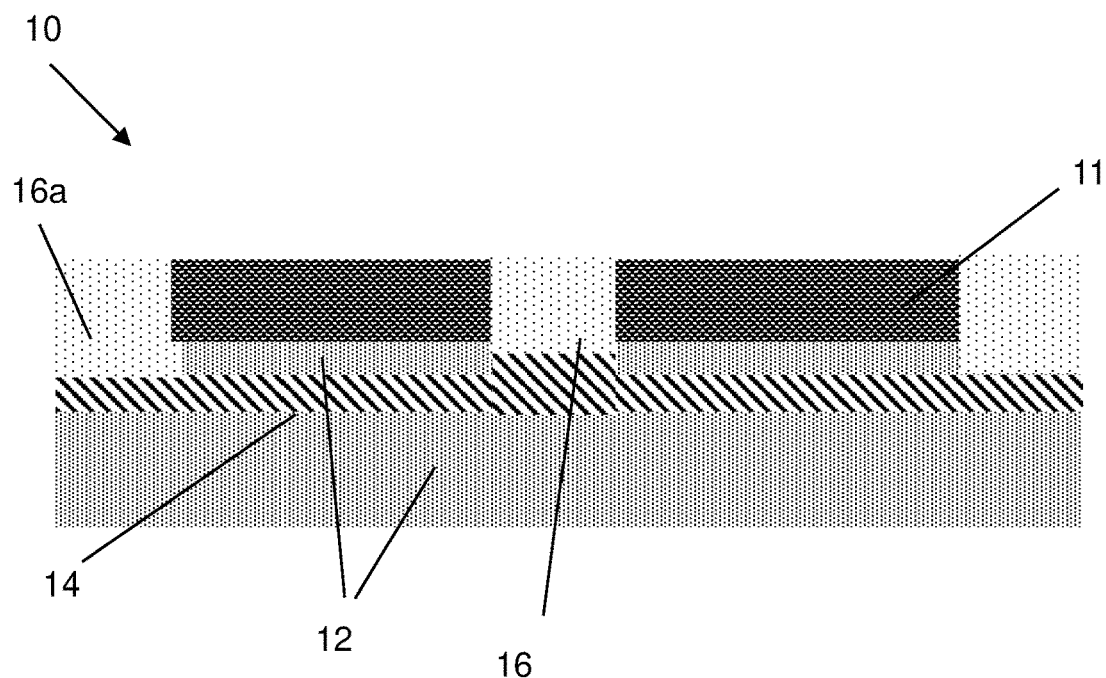
FIG. 1 shows a semiconductor substrate with shallow trench isolation structures, amongst other features, and respective fabrication processes in accordance with aspects of the present disclosure.

FIG. 1 shows a substrate and shallow trench isolation structures, amongst other features, and respective fabrication processes in accordance with aspects of the present disclosure. Specifically, the structure 10 of FIG. 1 includes a semiconductor substrate 12 with shallow trench isolation structures 16, 16a. In embodiments, the upper surfaces of the semiconductor substrate 12 and shallow trench isolation structures 16, 16a may be planar. Also, the shallow trench isolation structures 16 may be perpendicular and positioned between subsequently formed gate structures; whereas, the shallow trench isolation structures 16a is a conventional structure surrounding or adjacent to the subsequently formed gate structures. Moreover, in embodiments, the shallow trench isolation structure 16a may be of a different depth than the shallow trench isolation structures 16 (e.g., shallow trench isolation structure 16a may be deeper into the semiconductor substrate 12 than the shallow trench isolation structures 16).

In embodiments, the semiconductor substrate 12 is a bulk substrate composed of any suitable semiconductor material including, but not limited to, Si, SiGe, SiGeC, SiC, GaAs, InAs, InP, and other III/V or II/VI compound semiconductors. Semiconductor on glass or insulator is also contemplated as a substrate material. An optional high resistivity layer 14 can be provided within the semiconductor substrate 12. In embodiments, the high resistivity layer 14 may be a polysilicon layer formed by an argon implant process, although other methods and material layers are also contemplated herein. In further embodiments, the semiconductor substrate 12 may also be a high resistivity silicon substrate, e.g., resistivity>1000 ohm-cm, and the optional high resistivity layer 14 may be polysilicon with resistivity greater than the resistivity of the semiconductor substrate 12. For example, in embodiments, the optional high resistivity layer 14 has resistivity greater than 10 times that of the semiconductor substrate 12.

Dopants 11, such as to form, for example, wells, may be formed in the semiconductor substrate 12 between the shallow trench isolation structures 16, 16a. For simplicity, these implants will be referred to as well dopants, even though they may consist of additional implants such as asymmetric drain or isolation implants, for example. The well dopants 11 may be formed by conventional ion implantation processes. For example, the well dopants 11 may be formed by introducing a dopant by, for example, ion implantation that introduces a concentration of a dopant in the semiconductor substrate 12. A P-well is doped with p-type dopants, e.g., Boron (B), and an N-well is doped with n-type dopants, e.g., Arsenic (As), Phosphorus (P) and antimony (Sb), among other suitable examples.

The shallow trench isolation structures 16, 16a may be composed of oxide material, e.g., $SiO_2$, fabricated by conventional lithography, etching, deposition and planarization methods known to those of skill in the art. In embodiments, the shallow trench isolation structures 16 may be in the source/drain regions of subsequently formed devices. In further embodiments, the shallow trench isolation structures 16 may also be positioned perpendicular to the subsequently formed gate structures.

Shallow trench isolation structures, filled with insulator, are commonly employed to provide electrical isolation between active devices such as FETs such as shallow trench isolation structure 16a. In the structures described herein, though, the shallow trench isolation structures 16 are also placed in the source/drain region of the FET. In conventional structures, the shallow trench isolation structures are not placed in the source/drain regions because that would make it impossible to electrically connect the source/drain region of the FETs.

To fabricate the shallow trench isolation structures 16, 16a, for example, a resist formed over the semiconductor substrate 12 is exposed to energy (light) to form a pattern (opening). An etching process with a selective chemistry, e.g., reactive ion etching (RIE), will be used to form one or more trenches in the semiconductor substrate 12 through the openings of the resist. In embodiments, the openings extend through the well dopants 11 and to the optional high resistance layer 14. Following the resist removal by a conventional oxygen ashing process or other known stripants, the insulator material can be deposited by any conventional deposition processes, e.g., chemical vapor deposition (CVD) processes. Any residual material on the surface of the semiconductor substrate 12 can be removed by conventional chemical mechanical polishing (CMP) processes.

Figure 2:
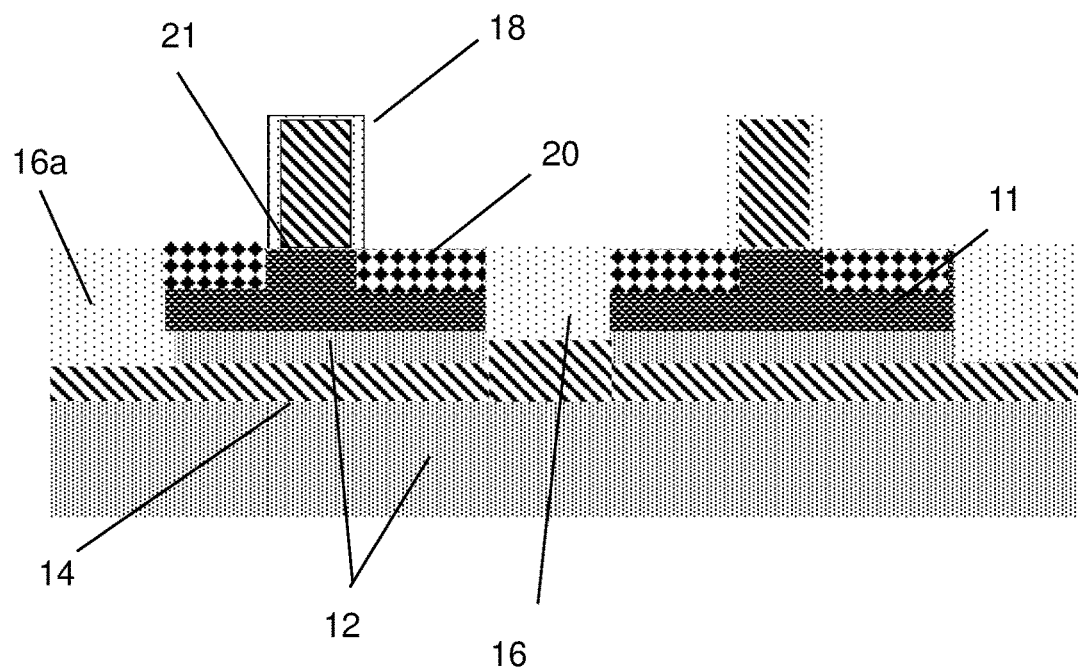
FIG. 2 shows gate structures formed on the semiconductor substrate, amongst other features, and respective fabrication processes in accordance with aspects of the present disclosure.

FIG. 2 shows a two finger FET (which may be representative of a multi-finger FET) with the shallow trench isolation structure 16a surrounding the FET and the shallow trench isolation structure 16 inside the source/drain region 20 of the FET. More specifically, in FIG. 2, FET gate structures (e.g., FETs) 18 are formed on the semiconductor substrate 12 adjacent to the shallow trench isolation structures 16, 16a. In embodiments, the shallow trench isolation structures 16 are perpendicular to and separated from the gate structures 18 to avoid significantly increasing contact resistance (Ron for a FET Switch). The gate structures 18 include gate dielectric material, gate material, e.g., polysilicon or metal material, and sidewall spacers, all of which are represented by reference numeral 18.

In embodiments, the gate dielectric material and gate material, e.g., polysilicon or metal material, may be formed by a standard deposition process, e.g., chemical vapor deposition (CVD), physical vapor deposition (PVD) including sputtering, atomic layer deposition (ALD) etc., followed by a patterning process, e.g., lithography and etching process. In a metal gate implementation, the metal materials (e.g., workfunction materials) for a p-channel FET include Ti, TiAlC, Al, TiAl, TaN, TaAlC, TiN, TiC and Co; whereas, workfunction materials for an n-channel FET include TiN, TaN, TaAlC, TiC, TiAl, TaC, Co, Al, HfTi, TiSi, TaSi or TiAlC. The sidewall spacers may be formed by a deposition of insulator material such as nitride or oxide on the patterned materials, followed by an anisotropic etching process. In embodiments, the gate structure is formed using damascene or FinFET processes known to those of skill in the art.

Still referring to FIG. 2, source/drain regions 20 are formed in the semiconductor substrate 12 adjacent to the gate structures 18. In embodiments, the source/drain regions 20 may be formed by conventional ion implantation processes that introduce a concentration of a dopant in the semiconductor substrate 12 such that no further explanation is required for a complete understanding of the present disclosure. In embodiments, the implants for the source/drain regions 20 may also be formed over the shallow trench isolation structure 16. In further embodiments, the source/drain implants may be formed over the shallow trench isolation structure 16, 16a. Moreover, the channel region 21 forms a planar surface, particularly with the source/drain regions 20.

In embodiments, the source/drain regions 20 are shallower than the shallow trench isolation structures 16, 16a. In other words, the shallow trench isolation structures 16, 16a are deeper into the semiconductor substrate 12 than the source/drain regions 20. In this way, the shallow trench isolation structures 16 will provide an effective insulative effect within the source/drain regions 20. In alternative embodiments, the source/drain regions 20 and the shallow trench isolation structures 16 may be at approximately a same depth within the semiconductor substrate 12. Also, as should be understood by those of skill in the art, the shallow trench isolation structures 16, 16a will remove some of the source/drain junction area, which will reduce Coff by providing an insulative region in the semiconductor substrate 12 within the source/drain regions 20.

Figure 3:
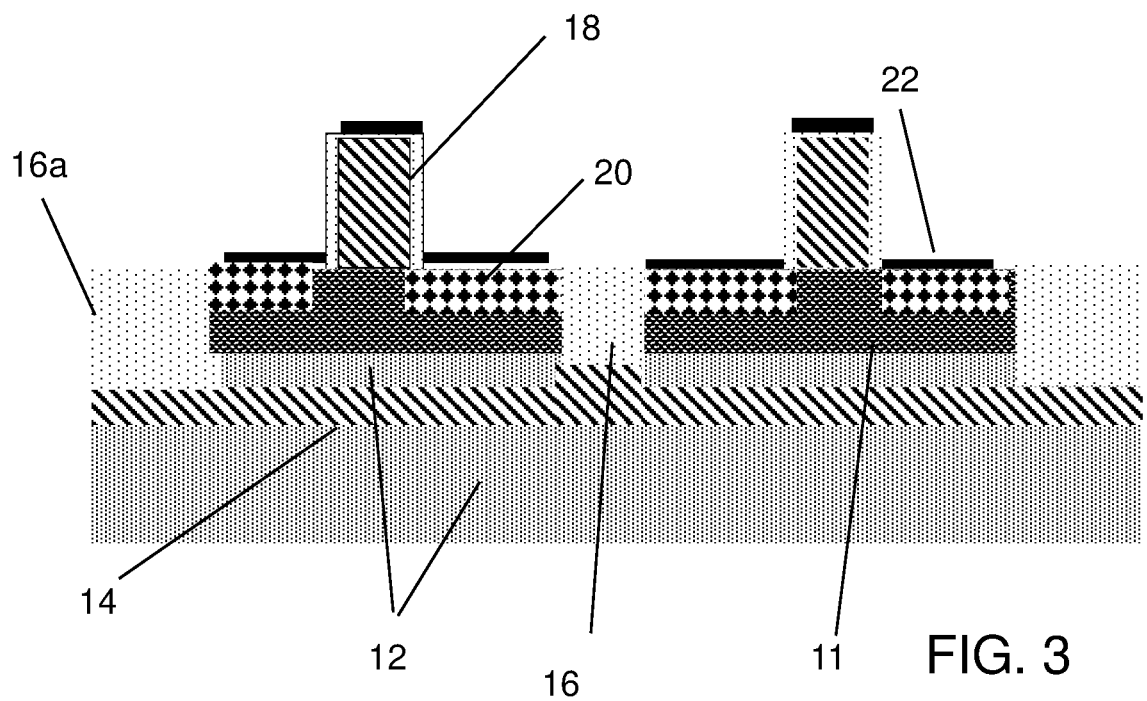
FIG. 3 shows silicided regions on source/drain regions of the gate structures, amongst other features, and respective fabrication processes in accordance with aspects of the present disclosure.

As shown in FIG. 3, after additional processing is performed for other features, e.g., spacer, halo, extension, well, etc., a silicide 22 is formed over the gate material 18 and source/drain regions 20. It should be understood that silicide would not be required for a metal gate structure. As should be understood by those of skill in the art, the silicide process begins with deposition of a thin transition metal layer, e.g., nickel, cobalt, titanium, or platinum, over fully formed and patterned semiconductor devices (e.g., source/drain regions 20 and respective devices 18). In embodiments, the transition metal layer may be $CoSi_2$ comprising a thin film resistivity of 14-20 microohm-cm. In any scenario, the silicide resistance will remain a fraction of Ron. In embodiments, the silicide resistance is a small fraction of Ron. For example, in embodiments, the silicide resistance may be less than 5% of Ron.

After deposition of the material, the structure is heated allowing the transition metal to react with exposed semiconductor substrate 12 in the active regions of the semiconductor device (e.g., source/drain regions 20 and gate contact region) forming a low-resistance transition metal silicide contact 22. Following the reaction, any remaining transition metal is removed by chemical etching, leaving the silicide contact 22 in the active regions of the device. It should be understood by those of skill in the art that the silicide will not form over any exposed material of the shallow trench isolation structure 16, 16a.

Figure 4:
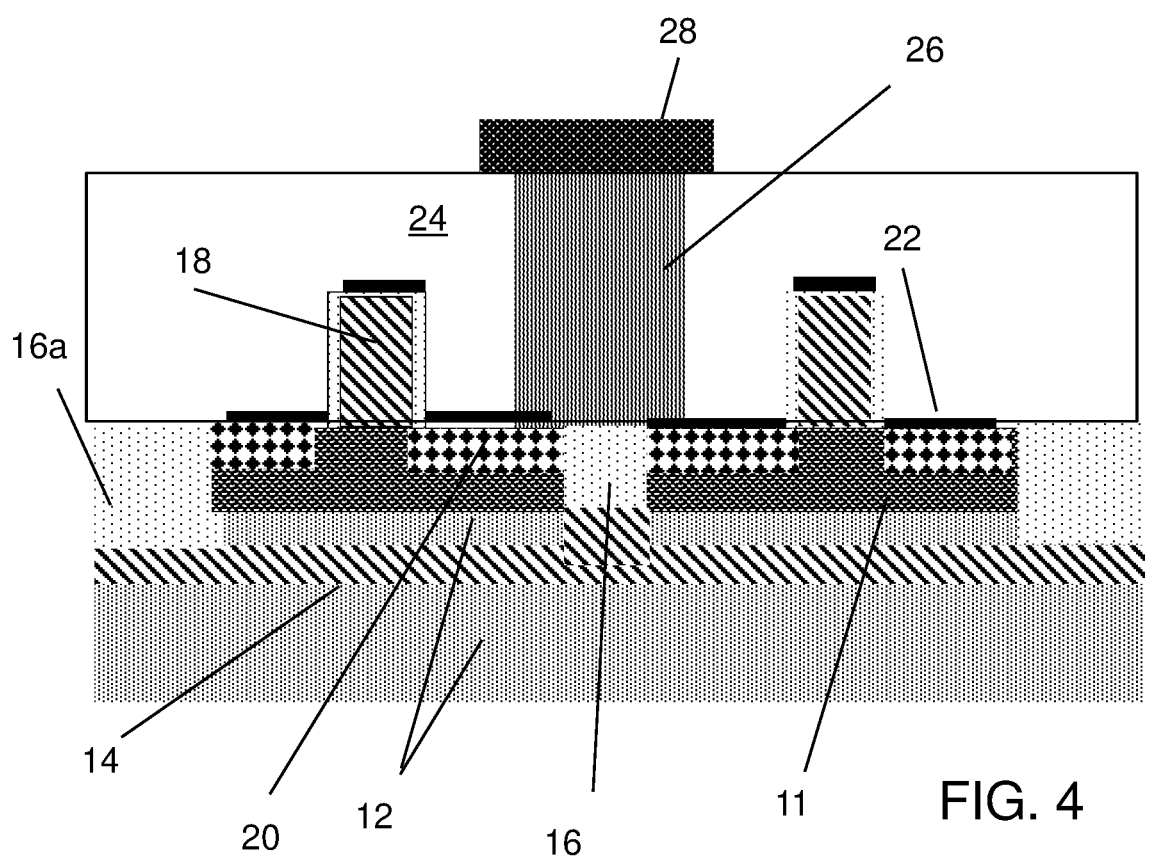
FIG. 4 shows contacts (interconnects) connecting to the silicided source/drain regions, amongst other features, and respective fabrication processes in accordance with aspects of the present disclosure.

FIG. 4 shows contacts (interconnects) 26 formed to the source/drain regions 20, spanning over the shallow trench isolation structure 16 between adjacent gate structures 18. In accordance with aspects of the present disclosure, interlevel dielectric material 24, e.g., $SiO_2$, may be formed over the gate structures 18 and silicide contacts 22 by a conventional deposition method, e.g., CVD. In embodiments, the interlevel dielectric material 24 contains PSG, BPSG for mobile ion gettering, or a low-k dielectric material such as SiCOH to reduce capacitance. After an optional planarization step using, for example, CMP, openings are formed within the interlevel dielectric material 24 to expose portions of the silicide contacts 22 in the source/drain regions 20 (and the gate structure 18). The openings will expose the semiconductor substrate 12 of the source/drain regions 20 and the shallow trench isolation structures 16. The openings can be formed by conventional lithography and etching processes such that no further explanation is required for an understanding of the present disclosure.

A metal or metal alloy material may be deposited in the openings, e.g., tungsten, cobalt, copper, aluminum, etc., to form the interconnects 26. Wiring structures 28 may then be formed by conventional back end of the line (BEOL) CMOS processes, connecting to the interconnects 26. The wiring structures 28 may be composed of aluminum, copper, or other metal or metal alloy materials that are suitable for CMOS fabrication processes.

Figure 5A:
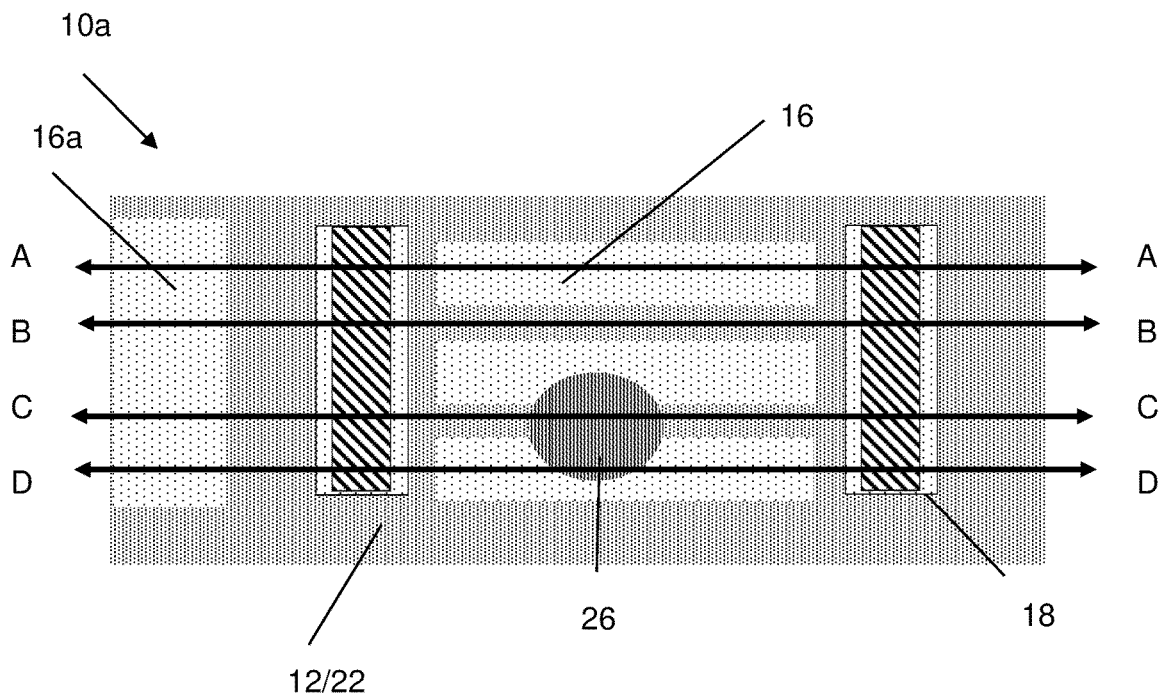
FIGS. 5A-5E show a top view and various cross-sectional views of the structure in accordance with aspects of the present disclosure.
Figure 5B:
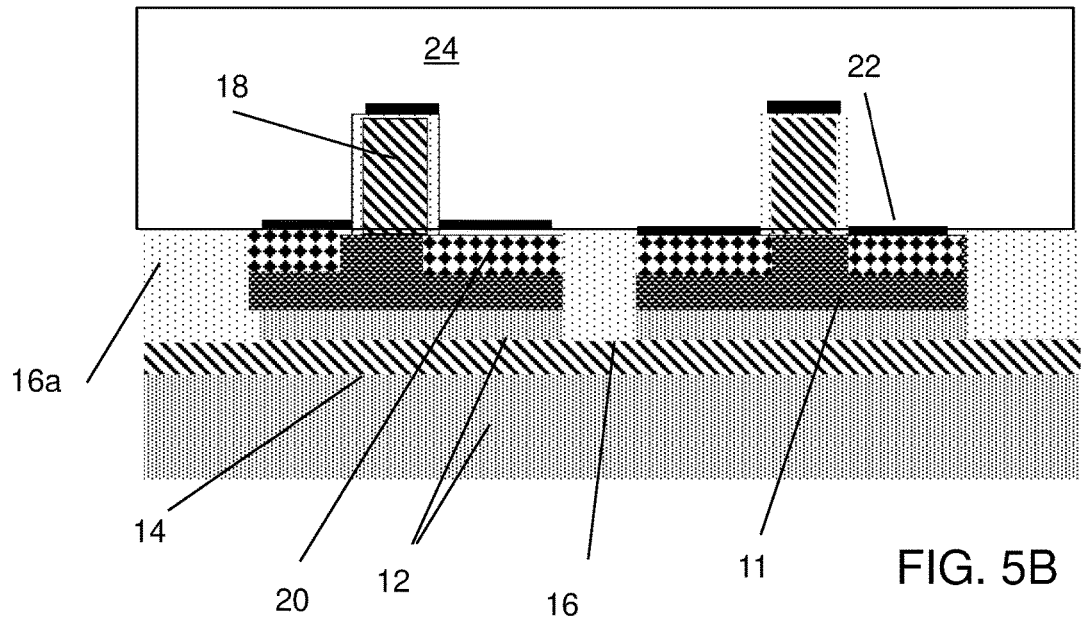
Figure 5C:
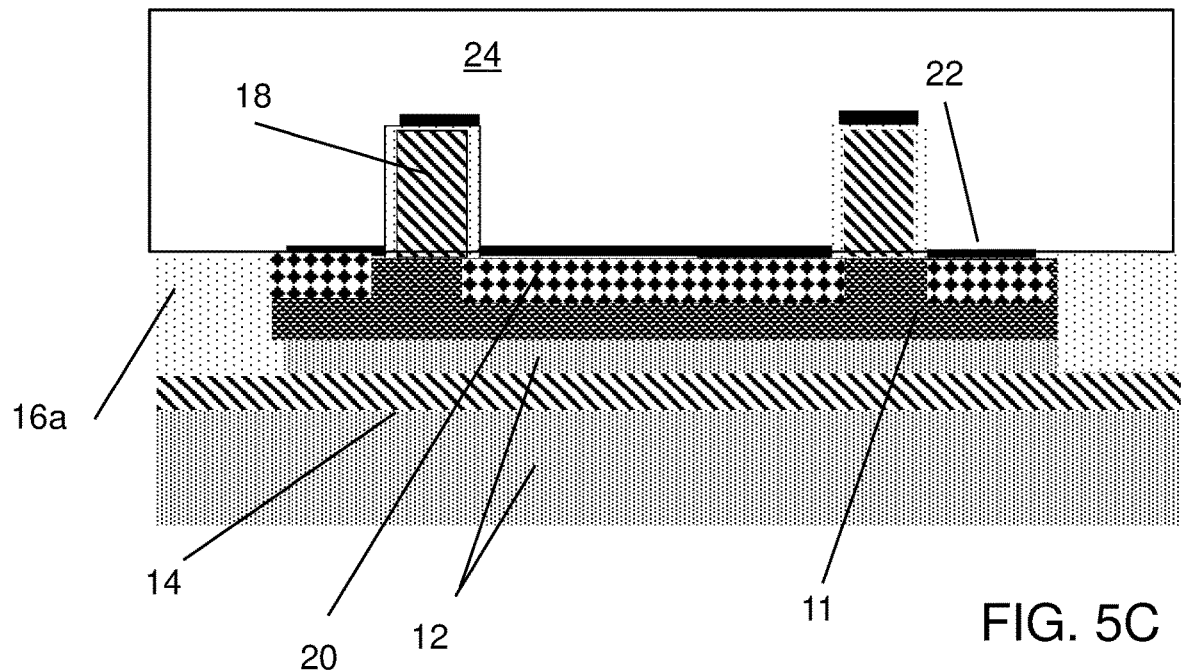
Figure 5D:
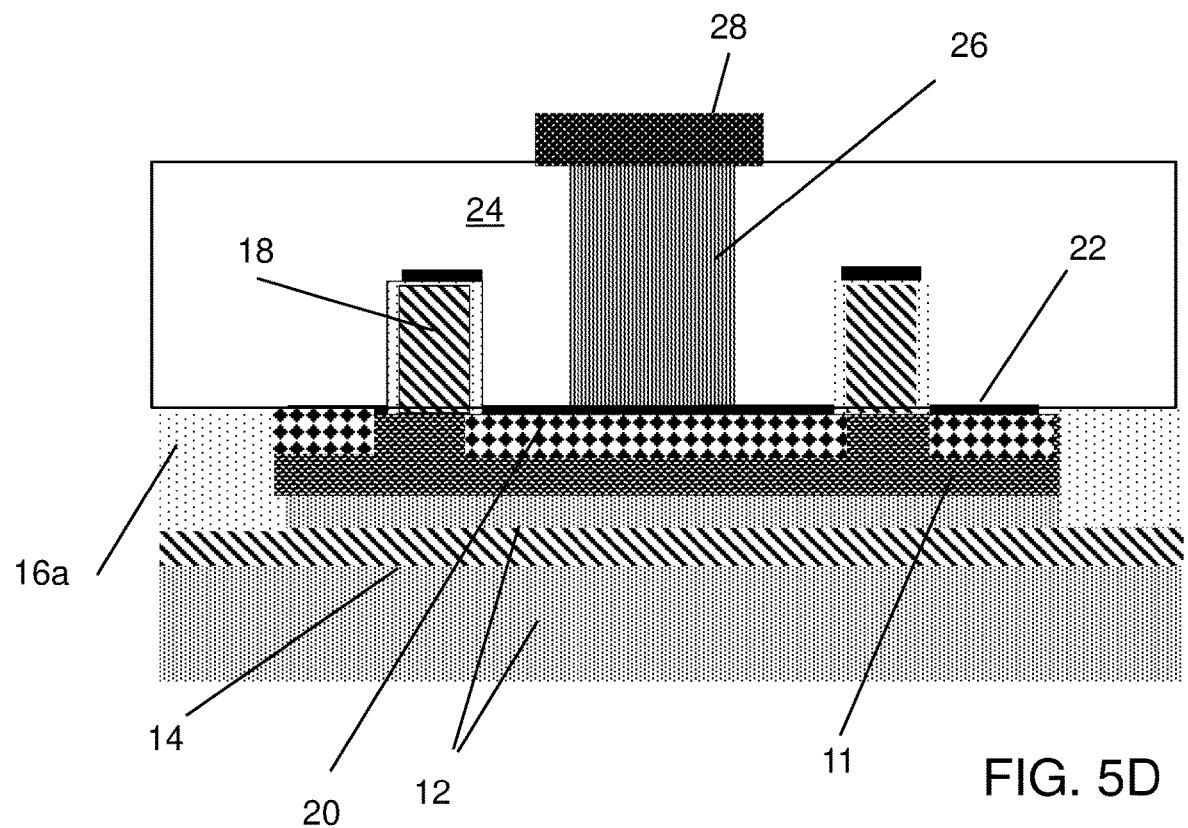
Figure 5E:
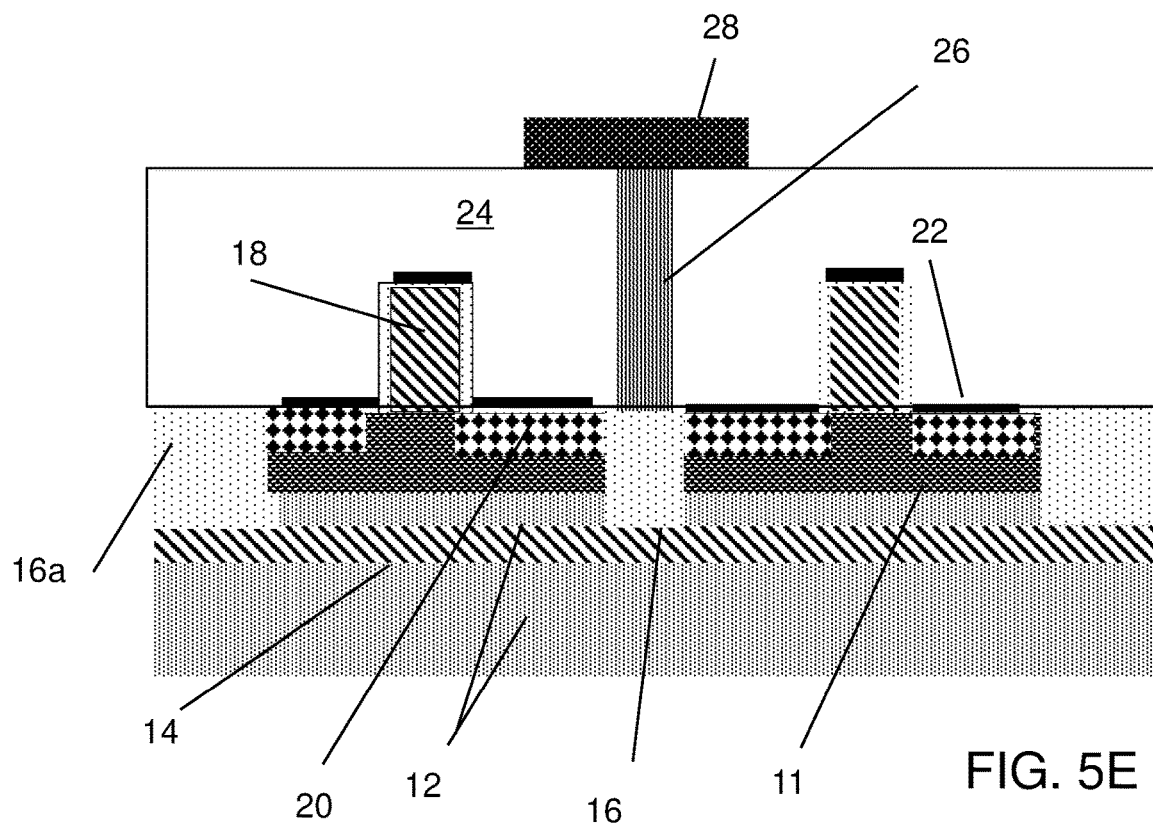

FIGS. 5A-5E show a top view and various cross-sectional views of the structure 10a in accordance with aspects of the present disclosure. More specifically, FIG. 5A shows a top view of the gate structures with shallow trench isolation structures in the source/drain regions 20 and adjacent to the shallow trench isolation structure 16a; whereas, FIG. 5B shows a cross-sectional view of the structure along line A-A, FIG. 5C shows a cross-sectional view of the structure along line B-B, FIG. 5D shows a cross-sectional view of the structure along line C-C, and FIG. 5E shows a cross-sectional view of the structure along line D-D.

As shown in FIGS. 5A-5E, the shallow trench isolation structures 16 are perpendicular to and between the gate structures 18; whereas, the shallow trench isolation structure 16a is a conventional structure which extends along a length of and, in embodiments, surrounds the gate structures 18. In addition, as shown in FIG. 5A, the interconnect structure 26 (e.g., contact) lands on both the shallow trench isolation structure 16 and the silicide contacts 22. The interconnect structure 26 may be circular in shape; although other shapes are contemplated herein.

As an illustrative, non-limiting example, the shallow trench isolation structures 16 may have a width of approximately 60 nm and a length of approximately 280 nm. A distance between adjacent shallow trench isolation structures 16 may be approximately 60 nm, and a distance between the shallow trench isolation structures 16 and the gate structures 18 may be approximately 80 nm. The distance between the gate structures 18 is thus approximately 440 nm. Also, in this embodiment, the shallow trench isolation structures 16, 16a have a same depth, which is deeper than the source/drain regions 20. It should be understood, though, that other dimensions are contemplated herein depending on the particular technology node, e.g., shallow trench isolation structures 16a may be deeper than the shallow trench isolation structures 16 due to, for example, RIE lag of the smaller shallow trench isolation structure 16 (with respect to the larger feature 16a).

Figure 6:
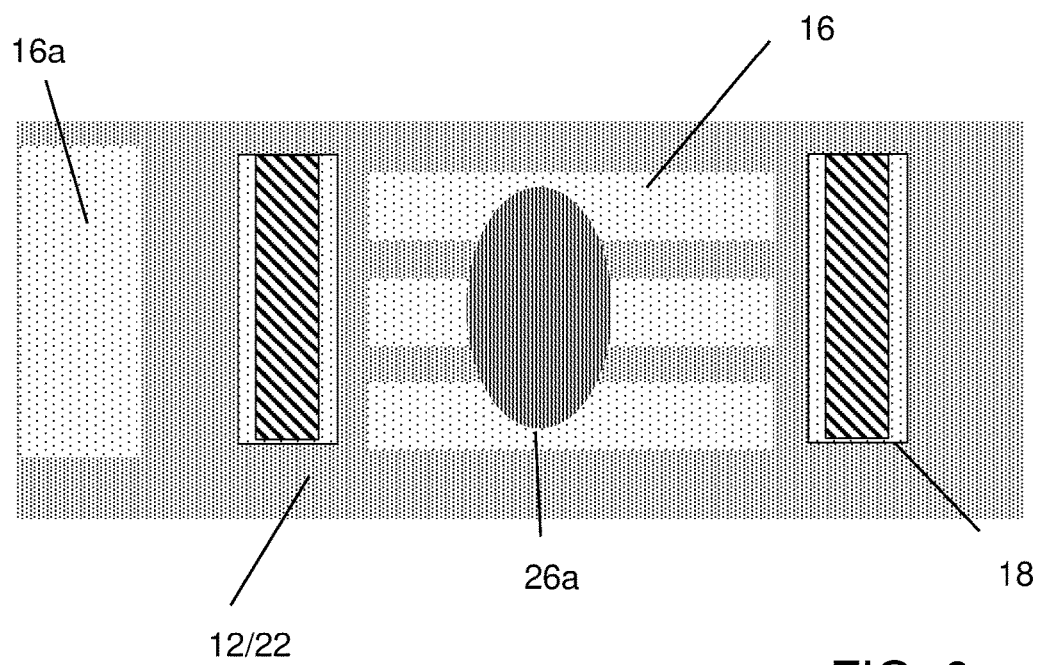
FIG. 6 shows an oval shaped interconnect structure in accordance with aspects of the present disclosure.

FIG. 6 shows an oval shaped interconnect structure (contact) 26a. In this embodiment, the oval shaped interconnect structure 26a may land on the silicide 22 and all the shallow trench isolation structures 16 between the gate structures 18. It is contemplated, though, that the oval shaped interconnect 26a may land on two or more of the shallow trench isolation structures 16. Moreover, the shallow trench isolation structure 16a completely surrounding the gate structures 18, i.e., shallow trench isolation structure 16a are provided adjacent to outer gate structures 18.

Figure 7:
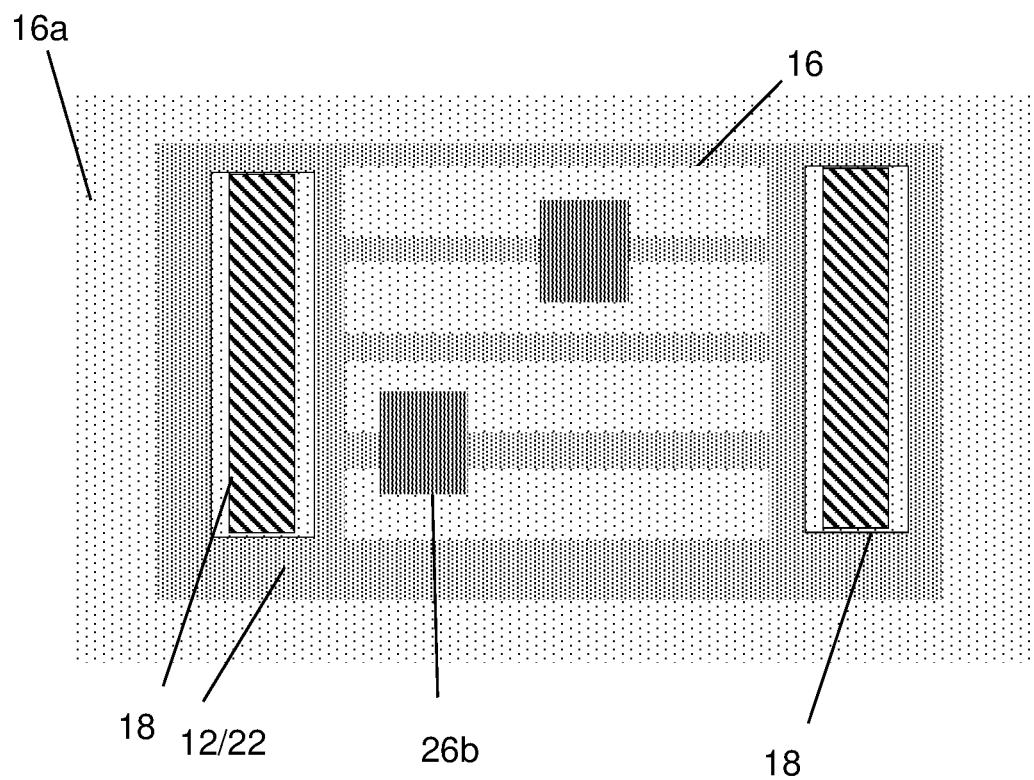
FIG. 7 shows a rectilinear shaped interconnect structure in accordance with aspects of the present disclosure.
Figure 8:
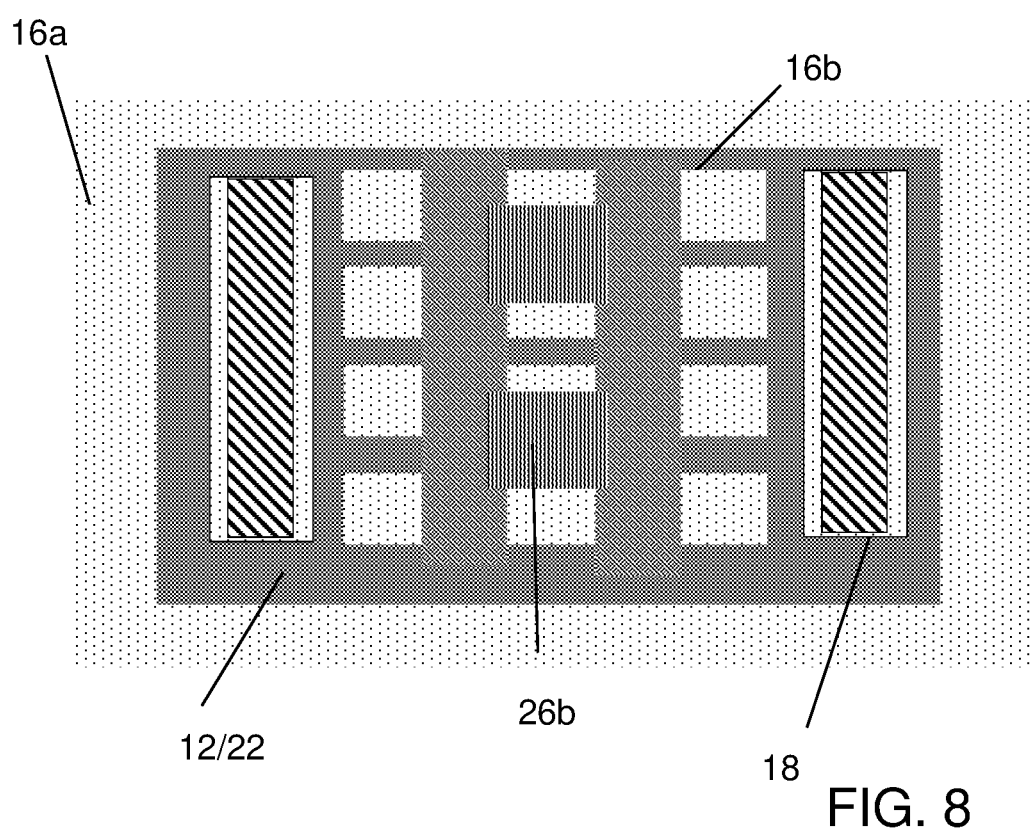
FIGS. 8-13 show various profiles of shallow trench isolation structures provided between gate structures in accordance with aspects of the present disclosure.

FIG. 7 shows the shallow trench isolation structure 16a completely surrounding the gate structures 18. In addition, in this embodiment, the interconnect structure (contact) 26b may be a rectilinear shape. In general, the contact 26b can be circular, oval, square, rectilinear, or any shape that can contact silicide around shallow trench isolation structure 16 of the source/drain region 20. Also, in this embodiment, two or more interconnect structures 26b are shown extending over adjacent shallow trench isolation structures 16 (e.g., four shallow trench isolation structures 16).

Figure 9:
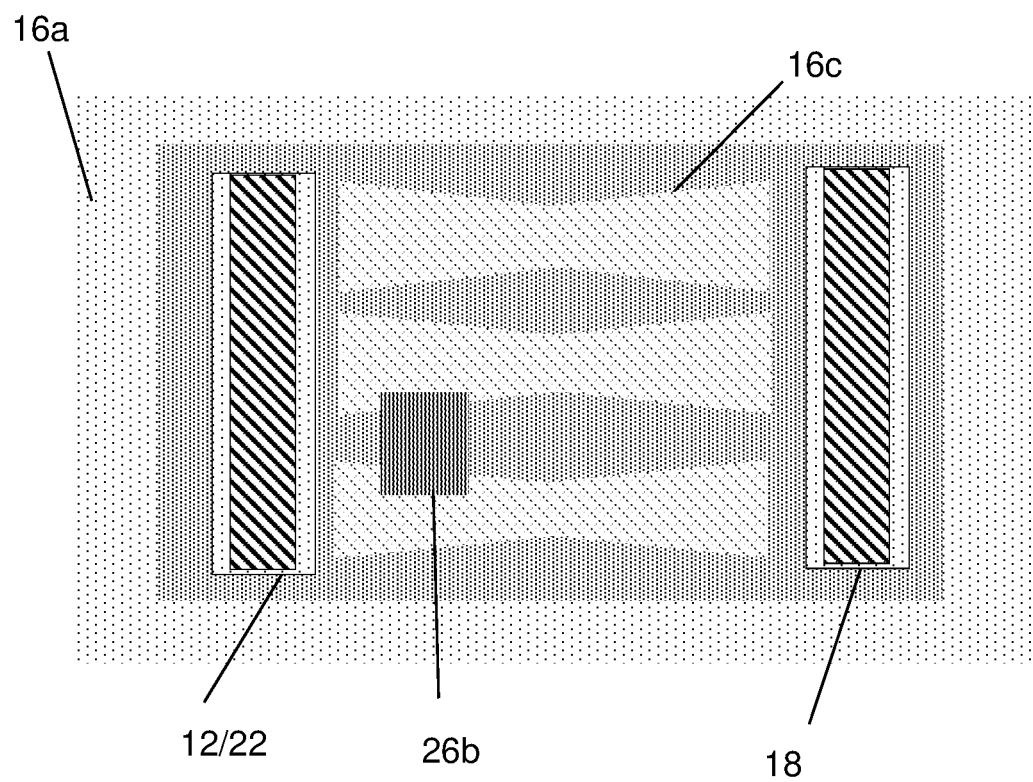
Figure 10:
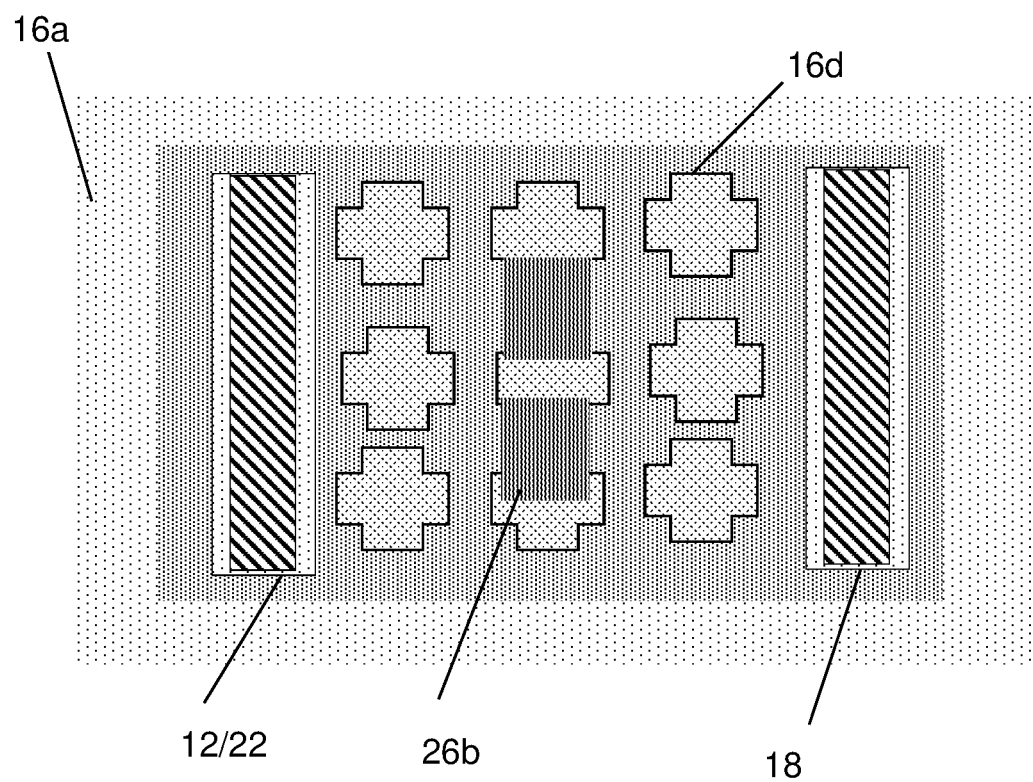
Figure 11:
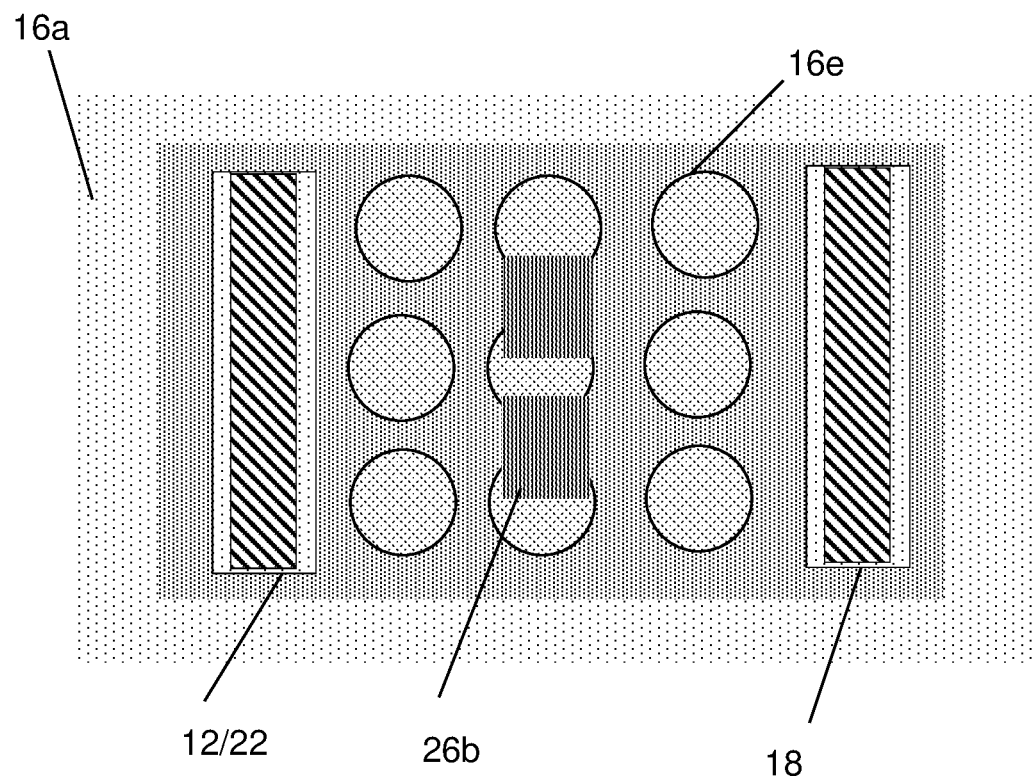
Figure 12:
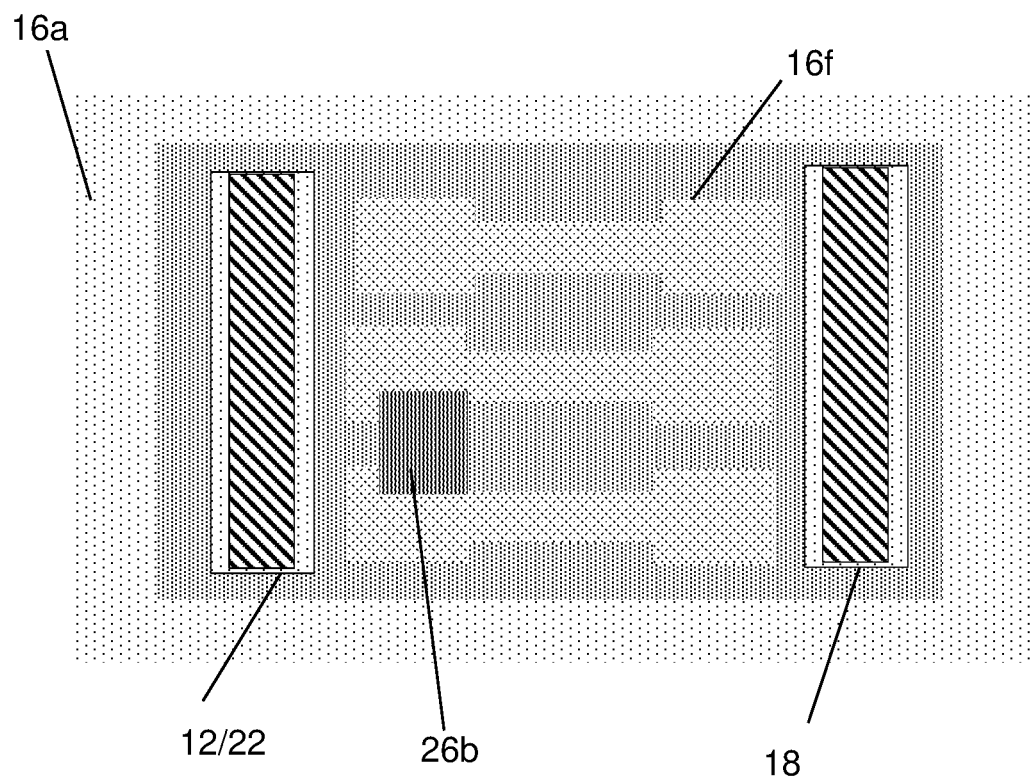
Figure 13:
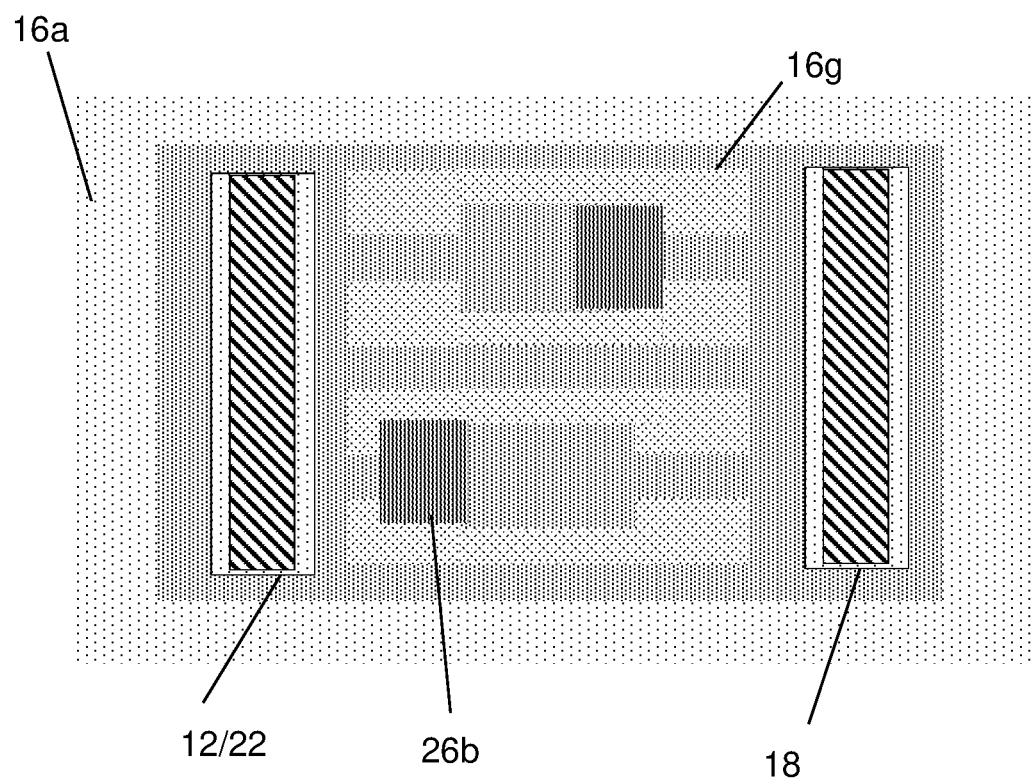

FIGS. 8-13 show various shapes or profiles of the shallow trench isolation structures between the gate structures 18. For example, in FIG. 8, the shallow trench isolation structures 16b may be shaped as square with the contacts placed over the squares, contacting at least one of them. In FIG. 9, the shallow trench isolation structures 16c may be bow shaped, e.g., tapered edges that widen as they extend outward). In FIG. 10, the shallow trench isolation structures 16d may be shaped as crosses. In FIG. 11, the shallow trench isolation structures 16e may be circular shaped (or oval shaped). In FIG. 12, the shallow trench isolation structures 16f may be shaped as barbells or dumbbells (e.g., a narrow stem portion with wider end portions). In FIG. 13, the shallow trench isolation structures 16g may be shaped as handles, with each pair facing one another.

The FETs can be utilized in system on chip (SoC) technology. It should be understood by those of skill in the art that SoC is an integrated circuit (also known as a "chip") that integrates all components of an electronic system on a single chip or substrate. As the components are integrated on a single substrate, SoCs consume much less power and take up much less area than multi-chip designs with equivalent functionality. Because of this, SoCs are becoming the dominant force in the mobile computing (such as in Smartphones) and edge computing markets. SoC is also commonly used in embedded systems and the Internet of Things.

The method(s) as described above is used in the fabrication of integrated circuit chips. The resulting integrated circuit chips can be distributed by the fabricator in raw wafer form (that is, as a single wafer that has multiple unpackaged chips), as a bare die, or in a packaged form. In the latter case the chip is mounted in a single chip package (such as a plastic carrier, with leads that are affixed to a motherboard or other higher level carrier) or in a multichip package (such as a ceramic carrier that has either or both surface interconnections or buried interconnections). In any case the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed:

1. A structure comprising:
   at least one gate structure on an underlying substrate material, the at least one gate structure comprising two gate structures;
   source/drain regions on opposing sides of each of the two gate structures;
   at least one shallow trench isolation structure perpendicular to and positioned between and contacting the source/drain regions between adjacent sides of the two gate structures; and
   a polysilicon layer under the source/drain regions of each of the two gate structures, which includes a portion contacting the at least one shallow trench isolation structure,
   wherein the at least one shallow trench isolation structure is between the two gate structures, and
   wherein the at least one shallow trench isolation structure comprises multiple shallow trench isolation structures, the multiple isolation structures comprise a first isolation structure positioned between the two gate structures and second isolation structures on sides of the two gate structures opposing the first isolation structure, each of which are contacting the polysilicon layer, and wherein the at least one shallow trench isolation structure extends deeper into the substrate material than the source/drain regions, and the portion of the polysilicon layer extends upward toward a surface of the underlying substrate material and in combination with remaining portions of polysilicon layer forms a T-shape.

2. The structure of claim 1, further comprising silicided semiconductor material in the source/drain regions adjacent to the at least one shallow trench isolation structure.

3. The structure of claim 2, further comprising an interconnect structure landing on both the at least one shallow trench isolation structure and the silicided semiconductor material in the source/drain regions.

4. The structure of claim 3, wherein the at least one gate structure comprises silicided polysilicon material.

5. The structure of claim 3, wherein the at least one gate structure comprises metal material.

6. The structure of claim 1, wherein the polysilicon layer is below the at least one shallow trench isolation structure and the source/drain regions and the at least one shallow trench isolation structure is located between the two gate structures at opposing sides of the two gate structures, the polysilicon material contacting the shallow trench isolation structure located between the two gate structures and on the opposing sides of the two gate structures.

7. The structure of claim 1, wherein the source/drain regions extend into a single well for each of the gate structures, above the polysilicon layer, and wherein the at least one shallow trench isolation structure extends below the single well and source/drain regions.

8. The structure of claim 1, wherein the first isolation structure comprises a depth shallower than the second isolation structures, and the first isolation structure and the second isolation structures directly contact the polysilicon layer below the two gate structures.

9. The structure of claim 1, wherein the at least one gate structure comprises sidewall spacers and the at least one shallow trench isolation structure is remotely position from the sidewall spacers.

10. A structure comprising:
    an implanted layer within a semiconductor substrate;
    a dopant well within the semiconductor substrate;
    at least two gate structures above the dopant well;
    source/drain regions in the dopant well between the at least two gate structures and at sides of the at least two gate structures;
    a shallow trench isolation structure extending below the dopant well within the semiconductor substrate, deeper than the source/drain regions and contacting the implanted layer;
    a second isolation structure extending below the dopant well and within the semiconductor substrate, deeper than the source/drain regions and the shallow trench isolation structure, the second isolation structure also contacting the implanted layer; and
    an interconnect structure that lands over the source/drain regions and aligned over the shallow trench isolation structure,
    wherein the interconnect structure comprises a contact to the source/drain regions and which is aligned over the shallow trench isolation structure between the two gate structures, and
    wherein the shallow trench isolation structure is-between the well structure and the implanted layer under the source/drain regions and silicide regions on both sides of the contact, and directly contacting the source/drain regions.

11. The structure of claim 10, wherein the shallow trench isolation structure contacts the implanted layer between the at least two gate structures.

12. The structure of claim 10, wherein the implanted layer comprises a high resistivity layer of semiconductor substrate of >1000 ohm-cm.

13. The structure of claim 12, wherein the high resistivity layer comprises a resistivity greater than a resistivity of the semiconductor substrate.

14. The structure of claim 10, wherein the implanted layer comprises polysilicon.

15. The structure of claim 10, wherein the implanted layer is an argon implanted layer.

16. A method comprising:
forming two gate structures on an underlying substrate material;
forming source/drain regions on opposing sides of each of the two gate structures;
forming at least one shallow trench isolation structure perpendicular to and positioned between and contacting the source/drain regions between adjacent sides of the two gate structures; and
forming a polysilicon layer under the source/drain regions of each of the two gate structures, which includes a portion contacting the at least one shallow trench isolation structure,
wherein the at least one shallow trench isolation structure is between the two gate structures, and
wherein the at least one shallow trench isolation structure comprises multiple shallow trench isolation structures, the multiple isolation structures comprise a first isolation structure positioned between the two gate structures and second isolation structures on sides of the two gate structures opposing the first isolation structure, each of which are contacting the polysilicon layer, and
wherein the at least one shallow trench isolation structure extends deeper into the substrate material than the source/drain regions, and the portion of the polysilicon layer extends upward toward a surface of the underlying substrate material and in combination with remaining portions of polysilicon layer forms a T-shape.

* * * * *